RECEIVER GAIN CONTROL SYSTEM PROVIDING NEGATIVE RESISTANCE STABILIZATION

Filed May 24, 1968

INVENTOR
JAMES W. DANIEL
BY Edward J. Norton
ATTORNEY

United States Patent Office 3,544,902
Patented Dec. 1, 1970

3,544,902
RECEIVER GAIN CONTROL SYSTEM PROVIDING NEGATIVE RESISTANCE STABILIZATION

James Walter Daniel, Jr., Cherry Hill, N.J., assignor to RCA Corporation, a corporation of Delaware
Filed May 24, 1968, Ser. No. 731,843
Int. Cl. H04b *1/16*
U.S. Cl. 325—411 6 Claims

ABSTRACT OF THE DISCLOSURE

An automatic gain control system for use with a receiver of the type which has an unstable negative resistance parametric amplifier as an input stage. The gain control system includes a variable attenuator comprising a photoresistive element and a light source responsive to a suitable control signal derived from the output of the receiver. The photoelectric coupling system so provided exhibits a high degree of linearity in that it introduces virtually no intermodulation products. Also, the photoelectric coupling system exhibits a high positive stabilization resistance that is coupled in series with the negative resistance exhibited by the unstable negative resistance amplifier to provide stabilization of the amplifier.

BACKGROUND OF THE INVENTION

Gain control systems used in present day receivers for the most part attenuate the RF signals by controlling the bias on the RF and IF amplifiers. This seriously degrades the linearity and dynamic range of the system. Ideally, therefore, part of the attenuation to the strong signals should be performed at the input to the receiver to prevent the first RF stage and the first mixer stage from becoming overloaded. Also many receivers utilize nonlinear devices such as pin diodes as the signal attenuation means. When this type of attenuator is used in a receiver which operates to receive an RF signal at a selected frequency in an environment with other RF signals whose frequencies are close to the selected frequency, these nonlinear devices degrade linearity and noise figure in that they introduce undesirable intermodulation products of the RF signals which are passed through the input bandpass. It is also desirable to provide low-loss attenuation of the selected RF signals at the input to the receiver over a large dynamic range so as not to degrade linearity or noise figure. Also, if the amplifier or converter input stage of the receiver is of the type that acts as a negative resistance amplifier or converter in that a negative resistance at the input frequency is exhibited across the input terminals of the receiver such as to cause regeneration, instability of the RF amplifier and converter occurs.

It is an object of this invention to provide an improved gain control system that includes a signal attenuator that exhibits a high, minimum positive resistance coupled in series with the negative resistance of a negative resistance amplifier so as to increase stability of the amplifier and to provide a low-loss RF signal attenuator that produces substantially no intermodulation products of the RF signals.

BRIEF DESCRIPTION OF THE INVENTION

Briefly, a gain control system is provided which makes use of a photoelectric coupling system as an attenuator and includes a photoresistive element and a light source. The system so provided being a linear resistive device as contrasted with nonlinear semiconductor devices does not introduce intermodulation products of the RF signals. Also this system exhibits a relatively high minimum resistance. The photoelectric coupling system is coupled in series between the input terminals of the receiver and an unstabilized negative resistance amplifier. A gain control signal is developed at the receiver following the amplifier and this control signal is applied to the photoelectric coupling system. A positive resistance of sufficient magnitude is provided in series with the input terminals to stabilize the negative resistance amplifier by maintaining a significant impedance in series with the input terminals to prevent the negative resistance from shunting the input circuit and to provide the proper attenuation of the RF signal without introducing intermodulation products of the RF signals.

DESCRIPTION OF A PREFERRED EMBODIMENT

The applicant's invention will be further described by reference to the accompanying drawings in which.

Figure 1:
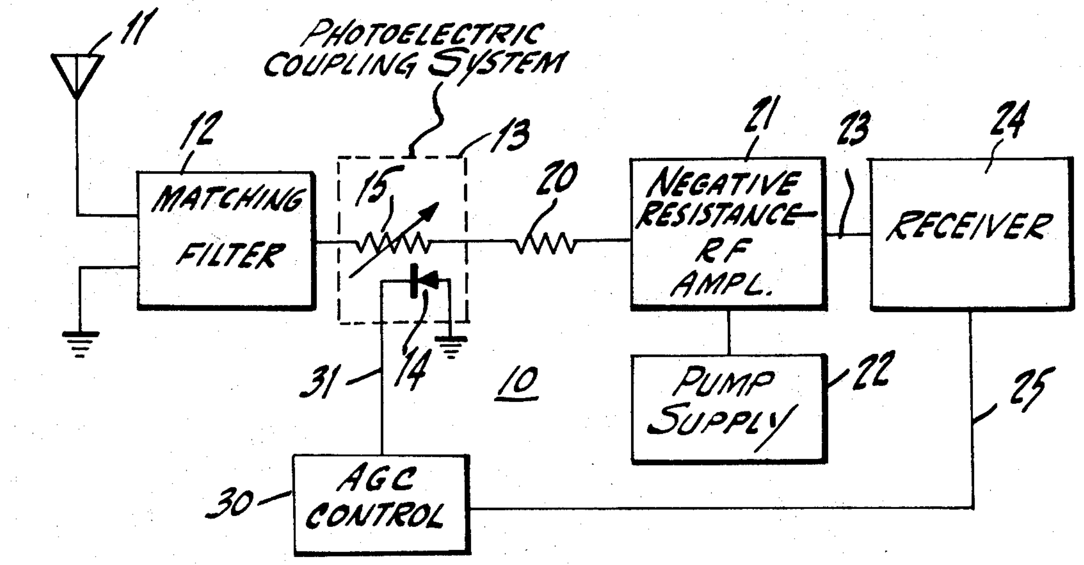
FIG. 1 illustrates a receiver equipped with an automatic gain control system in accordance with a preferred embodiment of this invention.

Referring to FIG. 1, the receiver 10 receives an RF signal from antenna 11. The RF signal is fed through matching filter 12, photoelectric coupling system 13 and fixed resistor 20 to an RF parametric amplifier 21 which exhibits a negative resistance at the input frequency of the amplifier to the receiver input terminals.

The term "photoelectric coupling system" includes both the photoresistive element and the light source whereby, for example, when the light intensity is increased the resistance is decreased. The output of the RF amplifier 21 is passed over lead 23 to and through a receiver 24 for processing the signal. An automatic gain control signal output from the receiver 24 is taken over lead 25 and applied to automatic gain control (AGC) 30. The output of control 30 is connected over lead 31 to the light source 14 of the photoelectric coupling system 13. The photoelectric coupling system 13, for example, is made up of a photoresistive element 15 which is illuminated by an array of gallium-arsenide light emitting diodes represented as diode 14. As the current through the light emitting diode 14 increases, the light is increased and correspondingly the resistance of the photoresistive element is reduced. The variable photoresistive element 15 which exhibits a relatively large minimum resistance together with the fixed resistor 20 provides the RF attenuation at the input of the receiver and maintains a sufficient impedance in series with the input terminals of the receiver as viewed by the RF amplifier or converter 21 to prevent the negative resistance of the parametric amplifier from shunting the input circuit and causing instability of the amplifier.

In operation, an output signal from the receiver is coupled to the AGC control 30 by means of AGC loop 25. At the AGC control 30 an output signal from the receiver 24 is detected and the detected output controls the amount of negative potential applied to the cathode of diode 14 and therefore controls the amount of current passed through the light emitting diode 14. When a large signal is detected at the output of receiver 24, the output of the AGC control 30 changes from a negative potential to a zero level turning off the light source 14 and the attenuation by the stabilization resistance 15 is largest. When a small signal is detected at the output of the receiver 24, the voltage output of the AGC control 30 changes to a negative voltage, −5 volts, for example, providing increased current through the light emitting diode 14 and consequently, the light output is increased, reducing the resistance of photoresistive element 15 and reducing the attenuation of the RF signals coupled at the input to the receiver. Due to the linear nature of the photoresistive element 15 virtually no significant intermodulation products due to the incoming RF signals are produced by this attenuator. Only third order intermodulation of 115 to 135 db down have been measured over a half active bandwith at high frequencies compared with other semiconductor attenuators which are on the order of 50 db down for example. The photoresistive element 15 uses selected materials such as lead or cadmium sulphide which exhibit this high degree of linearity to provide linear changes in attenuation between the extremes detected by the AGC output from the receiver.

Figure 2:
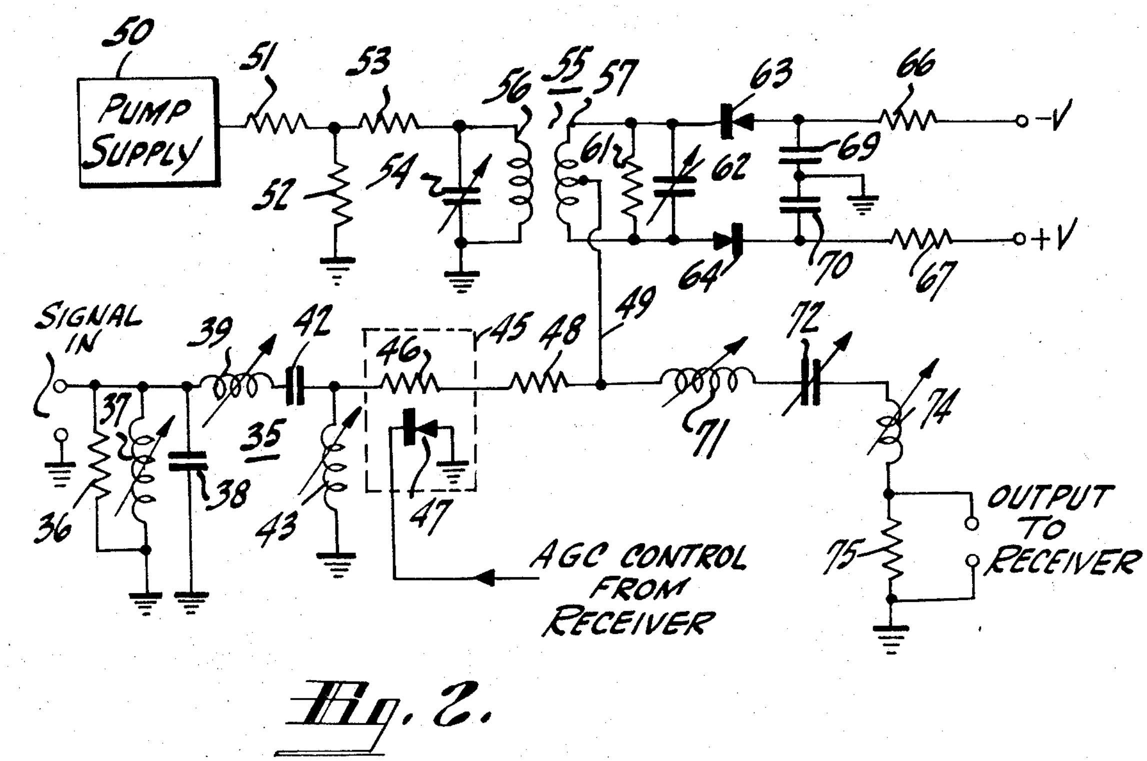
FIG. 2 is a schematic circuit diagram of a portion of the automatic gain control system in accordance with a preferred embodiment of the present invention.

FIG. 2 describes in more detail a circuit arrangement utilizing the photoelectric coupling system in conjuction with a parametric amplifier. Referring to FIG. 2, the pump supply 50 is coupled to a resistive network comprising resistors 51, 52 and 53. The function of this network is to provide an impedance match between the pump 50 and the primary 56 of transformer 55. The primary of the transformer 55 is tuned by means of a capacitor 54 to be resonant at the pump frequency. The secondary 57 of the transformer 55 is coupled at one end to the cathode of a nonlinear variable capacitance diode 63 and at the other end to the anode of variable capacitance diode 64. The function of the diodes or varactors 63 and 64 is to provide a variable capacitance which varies in accordance with the frequency of the pump supply 50 and hence are parametric elements. It is noted that other devices might be employed in lieu of diodes 63 and 64. Shunted across the secondary winding 57 is a resistor 61 and a capacitor 62. The function of capacitor 62 is to tune the secondary of transformer 55 to the pump frequency. The function of resistor 61 is to slightly lower the Q of the resonant circuit formed by the secondary 57 of the capacitor 62 to prevent spurious ringing of the circuit. The anode of the varactor 63 is coupled to resistor 66 and the other end of resistor 66 is coupled to a source of negative supply voltage. The cathode of varactor 64 is coupled to resistor 67 with the other end of the resistor 67 being coupled to a positive supply voltage. Capacitors 69 and 70 whose common terminal is coupled to a point of reference potential or ground are voltage divider capacitors and the voltage across these capacitors is used to reverse bias the diodes 63 and 64.

The applied input signal from the antenna, for example, is applied to the matching filter 35 made up of variable inductors 43, 39 and 37 and capacitors 38 and 42. The function of resistor 36 is to provide an impedance match between the signal input and the antenna element to reduce the standing wave ratio. The circuit 35 just described is a bandpass filter designed as a Butterworth circuit and whose elements are designed to accommodate the desired spectrum of operable frequencies of the RF signals including the selected frequency. A photoresistive element 46 of the photoelectric coupling system 45 is coupled in series with the resistor 48 with one terminal of this combination coupled to a center tap of the inductor 57 of the transformer 55. One function of the photoelectric coupling system 45 is first to provide sufficient minimum positive resistance to maintain significant impedance in series with the signal circuit 35 as viewed by the variable reactance circuit to prevent the negative resistance at the input frequency of the amplifier exhibited across the input terminals from shunting the signal circuit 35 and causing the amplifier to be unstable. A second function of the photoelectric coupling system 45 is to attenuate the incoming RF signal to prevent overloading of the first RF stages and the mixer stages by attenuating the strong RF signals that are passed through the input bandpass in a linear manner and so as not to introduce intermodulation products of the RF signals coupled through the bandpass. The circuit comprising the inductor 71, capacitor 72, inductor 74 and resistor 75 forms the idler circuit which couples the signal output from the parametric amplifier. The idler circuit is assumed in this case to be tuned to the difference in frequency between a substantially high pump frequency at pump supply 50 and a substantially low signal frequency so as to provide at the output of the amplifier a lower sideband up-conversion output. The output of the parametric amplifier is taken across the resistor 75 to the remaining part of the receiver.

The AGC voltage from the output of the receiver is used to control the amount of light emission from the light emitting diode 47 of photoelectric coupling system 45 which in turn changes the variable resistance 46 to provide more or less attenuation of the incoming signal. When, for example, the output from the receiver is at its maximum, zero voltage is provided at the output of the AGC control resulting in a minimum amount of current through the light emitting diode 47 causing no light to be emitted and maximum attenuation of the input signal by resistor 46. When the output from the receiver is at a minimum, a negative voltage (for example −5 volts), appears at the output of the AGC control causing greater current through the diode light source 47 causing substantial light to be applied to the photoresistive element 46 so as to reduce the resistance of the photoresistor 46 to provide less attenuation of the incoming signal.

Since photoresistive elements such as lead sulphide and cadmium sulphide have a minimum resistance of from twenty to fifty ohms, some loss of sensitivity would be encountered in a conventional receiver front end using these photoresistive elements as attenuators. However, as in this case, when the amplifier is of the type which exhibits a negative resistance at the input frequency across the input terminals such as the unstable negative resistance parametric amplifier described above, the relatively large positive resistance of the attenuator is used as a stabilization resistance and hence no loss in the gain that would normally be encountered in conventional front ends due to the large positive resistance will result. Since such a photoelectric coupling system exhibits extremely good linearity in that vicinity no significant intermodulation products of the RF signals are produced, this system also acts as an excellent low-loss RF attenuator for input signals when used in combination with such an amplifier. The relatively large positive resistance provided by the photoresistive element 46 also in series with an additional resistance 48 provides the stabilization resistance for a normally unstable amplifier.

What is claimed is:

1. An automatic gain control system for a radio frequency receiver wherein the RF signals applied to the receiver cover a substantially large band of frequencies and wherein said receiver includes an input amplifier which exhibits a negative resistance at the input frequency of the amplifier across the input terminals of the receiver causing instability of the amplifier, the improvement comprising:

an attenuator having a photoresistive element and a light emitting source coupled between said input terminals and said amplifier, said photoresistive element having a minimum resistance of sufficient magnitude to maintain a significant impedance in series with said input terminals to prevent said negative resistance from shunting said input terminals and thereby produce instability of said amplifier, said photoresistive element having a high degree of linearity in that said element introduces substantially no intermodulation products of said RF signals, means coupled to the output of said amplifier for receiving and processing the signal output of said amplifier, an AGC loop connected to said output means for developing an AGC control signal, means for applying said control signal to said light emitting source for controlling the resistance of said photoresistive element and correspondingly providing the correct amount of low-loss attenuation of the incoming RF signals without introducing intermodulation products.

2. The combination as claimed in claim 1 wherein said light emitting source comprises an array of light emitting diodes.

3. The combination as claimed in claim 2 wherein said array of light emitting diodes are gallium arsenide diodes.

4. The combination as claimed in claim 1 wherein said photoresistive element is in series with a fixed resistor wherein the combined resistance maintains said impedance to provide stabilization.

5. The combination as claimed in claim 1 wherein said photoresistive element is a lead sulphide element.

6. The combination as claimed in claim 1 wherein said photoresistive element is a specially selected cadmium sulphide element.

No references cited.

ROBERT L. GRIFFIN, Primary Examiner

R. S. BELL, Assistant Examiner

U.S. Cl. X.R.

330—96